US008558632B2

(12) United States Patent
Kris

(10) Patent No.: US 8,558,632 B2
(45) Date of Patent: *Oct. 15, 2013

(54) REPETITIVE SINGLE CYCLE PULSE WIDTH MODULATION GENERATION

(75) Inventor: Bryan Kris, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 91 days.

This patent is subject to a terminal disclaimer.

(21) Appl. No.: 13/248,328

(22) Filed: Sep. 29, 2011

(65) Prior Publication Data

US 2013/0082795 A1    Apr. 4, 2013

(51) Int. Cl.
*H03K 3/017*    (2006.01)

(52) U.S. Cl.
USPC .......................................... 332/109; 327/175

(58) Field of Classification Search
USPC .................... 332/109; 327/175, 172
See application file for complete search history.

(56) References Cited

U.S. PATENT DOCUMENTS

| 5,248,900 A * | 9/1993 | Davis | 327/176 |
| 6,658,583 B1 | 12/2003 | Kudo et al. | 713/500 |
| 7,362,152 B2 * | 4/2008 | Figoli | 327/172 |
| 7,545,190 B2 * | 6/2009 | Chiang et al. | 327/175 |
| 7,791,386 B2 * | 9/2010 | Kris | 327/160 |
| 8,008,958 B2 * | 8/2011 | Lefebvre | 327/175 |
| 8,362,819 B1 * | 1/2013 | Kris | 327/175 |
| 2009/0002043 A1 | 1/2009 | Kris | 327/175 |

FOREIGN PATENT DOCUMENTS

WO    2006/023427 A2    3/2006

OTHER PUBLICATIONS

International Search Report and Written Opinion, Application No. PCT/US2012/055885, 8 pages, Apr. 5, 2013.

* cited by examiner

*Primary Examiner* — Joseph Chang
(74) *Attorney, Agent, or Firm* — King & Spalding L.L.P.

(57)    ABSTRACT

Multiple pulse width modulation (PWM) generators each have a separate phase offset counter creating a phase shift. The phase shifting process is separated from the duty cycle generation process, thereby easing the task of preserving the duty cycle and phase relationships among the various PWM channels following an asynchronous external synchronization event. A master time base generates a PWM cycle start signal that resets the phase offset counters in each of the PWM generator circuits. The phase offset counter continues counting until it matches the respective phase offset value. Then, the associated duty cycle counter is reset and restarted. The duty cycle continues until its count matches the specified value at which time the duty cycle counter stops until reset by the terminal count from the phase offset counter. The output of the duty cycle comparators provide the output PWM signals as a repetitive series of single cycle PWM signals.

18 Claims, 7 Drawing Sheets

US 8,558,632 B2

REPETITIVE SINGLE CYCLE PULSE WIDTH MODULATION GENERATION

TECHNICAL FIELD

The present disclosure relates generally to generation of pulse width modulation (PWM) signals, and more particularly to repetitive single cycle PWM signals.

BACKGROUND

Digital switch mode power supply (SMPS) power conversion applications are becoming increasingly more sophisticated in having multiple sub-circuits that utilize multiple pulse width modulation (PWM) signals that may operate at different frequencies and/or phase shifts. When externally synchronizing multiple phase shifted PWM signals, or groups of PWM signal channels with differing frequencies, conventional methods of generating the multiple phase shifted PWM signals cannot maintain proper phase relationships between the PWM signals following a synchronization event. Most present technology PWM controllers are implemented with analog circuitry which does not support advanced PWM protocols, and most digital PWM controllers were designed for simple motor control which also does not support advanced PWM protocols.

SUMMARY

Therefore, what is needed is a way to maintain proper phase relationships between the PWM signals following a synchronization event. According to the teachings of this disclosure, a plurality of pulse width modulation (PWM) generators are provided, each having a separate phase offset counter to create a phase shift instead of using either a time base counter preload value or an adder to create the phase shift offset relative to the PWM time base and the duty cycle. The phase shifting process is separated from the duty cycle generation process, thereby easing the task of preserving the duty cycle and phase relationships among the various PWM channels following an asynchronous external synchronization event. At least one master time base generates a PWM cycle start signal that resets the phase offset counters in each of the PWM generator circuits. The phase offset counter continues counting until it matches the respective phase offset value. At that time, the associated duty cycle counter is reset and restarted. The duty cycle continues until its count matches the specified duty cycle value at which time the duty cycle counter stops until reset by the terminal count from the phase offset counter. The output of the duty cycle comparators provide the output PWM signals as a repetitive series of single cycle PWM signals.

According to a specific example embodiment of this disclosure, an apparatus for generating a repetitive single cycle PWM signal (350) comprises: a duty cycle register (310) storing a duty cycle value; a duty cycle counter (314) having a clock input coupled to a clock generating a plurality of clock pulses and incrementing a duty cycle count value for each of the plurality of clock pulses received; a duty cycle comparator (312) coupled to the duty cycle register (310) and the duty cycle counter (314), wherein the duty cycle comparator (312) compares the duty cycle count value to the duty cycle value and generates a PWM signal (350) when the duty cycle count value is less than or equal to the duty cycle value and stops the duty cycle counter (314) when the duty cycle count value is greater than the duty cycle value; a phase counter (320) having a clock input coupled to the clock generating the plurality of clock pulses and incrementing a phase count value for each of the plurality of clock pulses received, and a reset input adapted for coupling to a PWM cycle start signal from a time base, wherein when the PWM cycle start signal is asserted the phase count value is reset to zero, thereby restarting the phase counter (320); a phase offset register (316) storing a phase offset value; and a phase offset comparator (318) coupled to the phase offset register (316), the phase counter (320) and a stop input thereof, wherein the phase offset comparator (318) compares the phase count value to the phase offset value and stops the phase counter (320) when the phase count value is equal to the phase offset value and resets the duty cycle value to zero, thereby restarting the duty cycle counter (314).

According to another specific example embodiment of this disclosure, a system for generating a plurality of repetitive single cycle pulse width modulation (PWM) signals (350) comprises: a master time base generator (300), wherein the master time base generator (300) comprises: a master period register (304) storing a master period value; a master period counter (308) having a clock input coupled to a clock generating a plurality of clock pulses, and incrementing a master count value for each of the plurality of clock pulses received; a master period comparator (306) coupled to the master period register (304) and the master period counter (308), wherein the master period comparator (306) compares the master count value to the master period value, generates a PWM cycle start signal (332) when the master count value is equal to or greater than the master period value, and then resets the master count value in the master period counter (308) to zero; and a plurality of PWM generators (302) for generating a plurality of repetitive single cycle PWM signals (350), each of the plurality of PWM generators (302) comprises: a duty cycle register (310) storing a duty cycle value; a duty cycle counter (314) having a clock input coupled to the clock and incrementing a duty cycle count value for each of the plurality of clock pulses received; a duty cycle comparator (312) coupled to the duty cycle register (310) and the duty cycle counter (314), wherein the duty cycle comparator (312) compares the duty cycle count value to the duty cycle value and generates a PWM signal (350) when the duty cycle count value is less than or equal to the duty cycle value and stops the duty cycle counter (314) when the duty cycle count value is greater than the duty cycle value; a phase counter (320) having a clock input coupled to the clock generating the plurality of clock pulses and incrementing a phase count value for each of the plurality of clock pulses received and a reset input coupled to the master time base (300), wherein when the PWM cycle start signal (332) from the master time base (300) is asserted the phase count value is reset to zero, thereby restarting the phase counter (320); a phase offset register (316) storing a phase offset value; and a phase offset comparator (318) coupled to the phase offset register (316), the phase counter (320) and a stop input thereof, wherein the phase offset comparator (318) compares the phase count value to the phase offset value and stops the phase counter (320) when the phase count value is equal to the phase offset value and resets the duty cycle value to zero, thereby restarting the duty cycle counter (314).

According to yet another specific example embodiment of this disclosure, a system for generating a plurality of repetitive single cycle pulse width modulation (PWM) signals (350) comprises: a plurality of time base generators (542), wherein each of the plurality of time base generators (542) comprises: a period register (304) storing a period value; a period counter (308) having a clock input coupled to a clock generating a plurality of clock pulses, and incrementing a period count value for each of the plurality of clock pulses received; a period comparator (306) coupled to the period register (304) and the period counter (308), wherein the period comparator (306) compares the period count value to the period value, generates a PWM cycle start signal (332) when the count value is equal to or greater than the period value, and then resets the count value in the period counter (308) to zero; a plurality of multiplexers (540) having inputs coupled to the PWM cycle start signals (332) from the plurality of time base generators (542); and a plurality of PWM generators (302) for generating a plurality of repetitive single cycle PWM signals (350), each of the plurality of PWM generators (302) comprises: a duty cycle register (310) storing a duty cycle value; a duty cycle counter (314) having a clock input coupled to the clock and incrementing a duty cycle count value for each of the plurality of clock pulses received; a duty cycle comparator (312) coupled to the duty cycle register (310) and the duty cycle counter (314), wherein the duty cycle comparator (312) compares the duty cycle count value to the duty cycle value and generates a PWM signal (350) when the duty cycle count value is less than or equal to the duty cycle value and stops the duty cycle counter (314) when the duty cycle count value is greater than the duty cycle value; a phase counter (320) having a clock input coupled to the clock generating the plurality of clock pulses and incrementing a phase count value for each of the plurality of clock pulses received and a reset input coupled to an output of a respective one of the plurality of multiplexers (540), wherein a respective PWM cycle start signal (332) is selected through the plurality of multiplexers and when asserted the phase count value is reset to zero, thereby restarting the phase counter (320); a phase offset register (316) storing a phase offset value; and a phase offset comparator (318) coupled to the phase offset register (316), the phase counter (320) and a stop input thereof, wherein the phase offset comparator (318) compares the phase count value to the phase offset value and stops the phase counter (320) when the phase count value is equal to the phase offset value and resets the duty cycle value to zero, thereby restarting the duty cycle counter (314).

According to still another specific example embodiment of this disclosure, a method for generating a plurality of repetitive single cycle pulse width modulation (PWM) signals comprises the steps of: storing a master period value in a master period register (304); incrementing a master count value in a master period counter (308) for each clock pulse received by the master period counter (308); comparing the master count value to the master period value with a master period comparator (306); generating a PWM cycle start signal when the master count value is equal to or greater than the master period value and then resetting the master count value to zero; restarting a plurality of PWM generators (302) with the PWM cycle start signal, wherein each of the plurality of PWM generators (302) generates a PWM signal that is synchronized with the PWM cycle start signal, operation of each of the plurality of PWM generators (302) comprises the steps of: storing a duty cycle value in a duty cycle register (310); incrementing a duty cycle count value in the duty cycle counter (314) for each clock pulse received by the duty cycle counter (314); comparing the duty cycle count value to the duty cycle value with a duty cycle comparator (312); generating a PWM signal when the duty cycle count value is less than or equal to the duty cycle value; stopping the duty cycle counter (314) when the duty cycle count value is greater than the duty cycle value; storing a phase offset value in a phase offset register (316); incrementing a phase count value in the phase counter (320) for each clock pulse received by the phase counter (320); comparing the phase count value to the phase offset value with a phase offset comparator (318); stopping the phase counter (320) and resetting the duty cycle count value to zero when the phase count value is equal to the phase offset value; and resetting the phase count value to zero when the PWM cycle start signal is received by the phase counter (320).

BRIEF DESCRIPTION OF THE DRAWINGS

A more complete understanding of the present disclosure thereof may be acquired by referring to the following description taken in conjunction with the accompanying drawings wherein.

Figure 1:
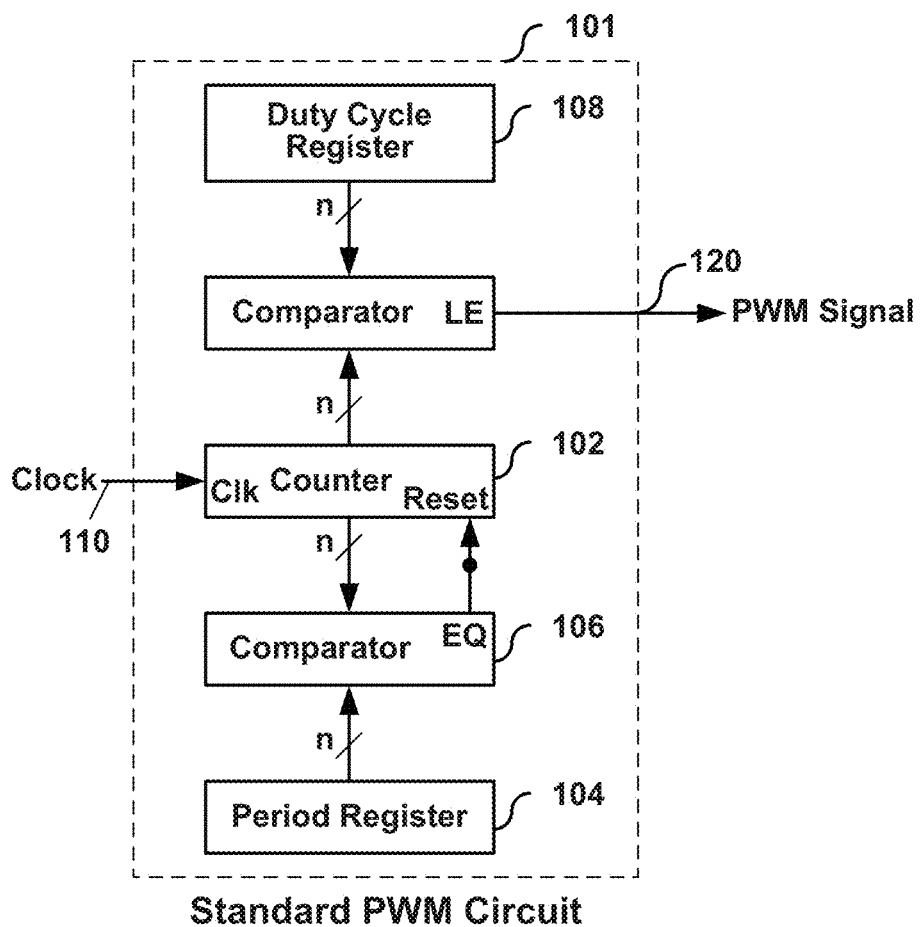
FIG. 1 illustrates a typical pulse width modulation (PWM) generator circuit.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a typical pulse width modulation (PWM) generator circuit. The PWM generator circuit 101 comprises a timer/counter 102, a period register 104, a comparator 106 and a duty cycle register 108. The timer/counter 102 counts up from zero until it reaches a value specified by the period register 104 as determined by the comparator 106. The period register 104 contains a user specified value which represents the maximum counter value that determines the PWM period. When the timer/counter 102 matches the value in the period register 104, the timer/counter 102 is cleared by a reset signal from the comparator 106, and the cycle repeats. The duty cycle register 108 stores the user specified duty cycle value. A PWM output signal 120 is asserted (driven high) whenever the timer/counter 102 value is less than the duty cycle value stored in the duty cycle register 108. The PWM output signal 120 is de-asserted (driven low) when the timer/counter value 102 is equal to or greater than the duty cycle value stored in the duty cycle register 108.

Figure 2:
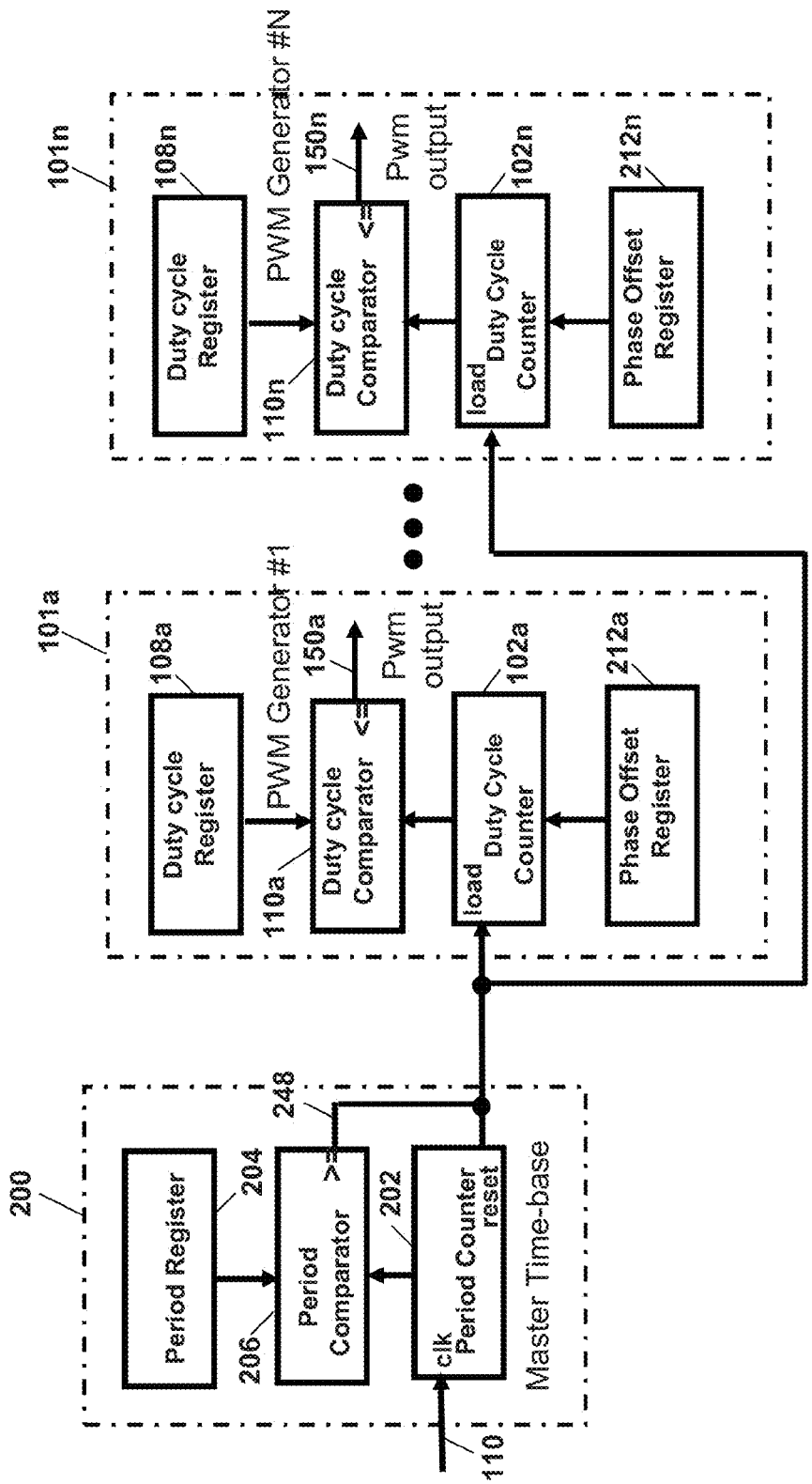
FIG. 2 illustrates a schematic block diagram of a multiphase PWM signal generation circuit having a master time base and used for generating groups of synchronized PWM signals having phase offsets between each of the PWM signals.

Referring to FIG. 2, depicted is a schematic block diagram of a multiphase PWM signal generation circuit having a master time base and used for generating groups of synchronized PWM signals having phase offsets between each of the PWM signals. The multiphase PWM generation circuit comprises a master time-base 200 and a plurality of PWM generators 101. The master time-base 200 comprises a period register 204, period comparator 206 and a period counter 202 that control the period of each of the PWM signals from the PWM generators 101a-101n. Each of the PWM generators 101 comprises a phase offset register 212 that is used to determine the phase offset of the respective PWM output signal from each of the PWM generators 101. The PWM period register 204, duty cycle registers 108 and phase-offset registers 212 are programmed to values required to obtain a desired operating frequency (period), duty cycle and phase-offset, respectively, for each of the PWM generators 101. The local duty cycle counters 102 are synchronized to the master time-base 200 by a PWM cycle start signal 248 from the period comparator 206. The individual PWM signal outputs 150 may differ in phase (determined by the respective phase offset registers 212) but not in frequency (period) as determined by the contents of the period register 204. Clock inputs to duty cycle counters 102 are not shown for simplification of the schematic block diagram.

Figure 3:
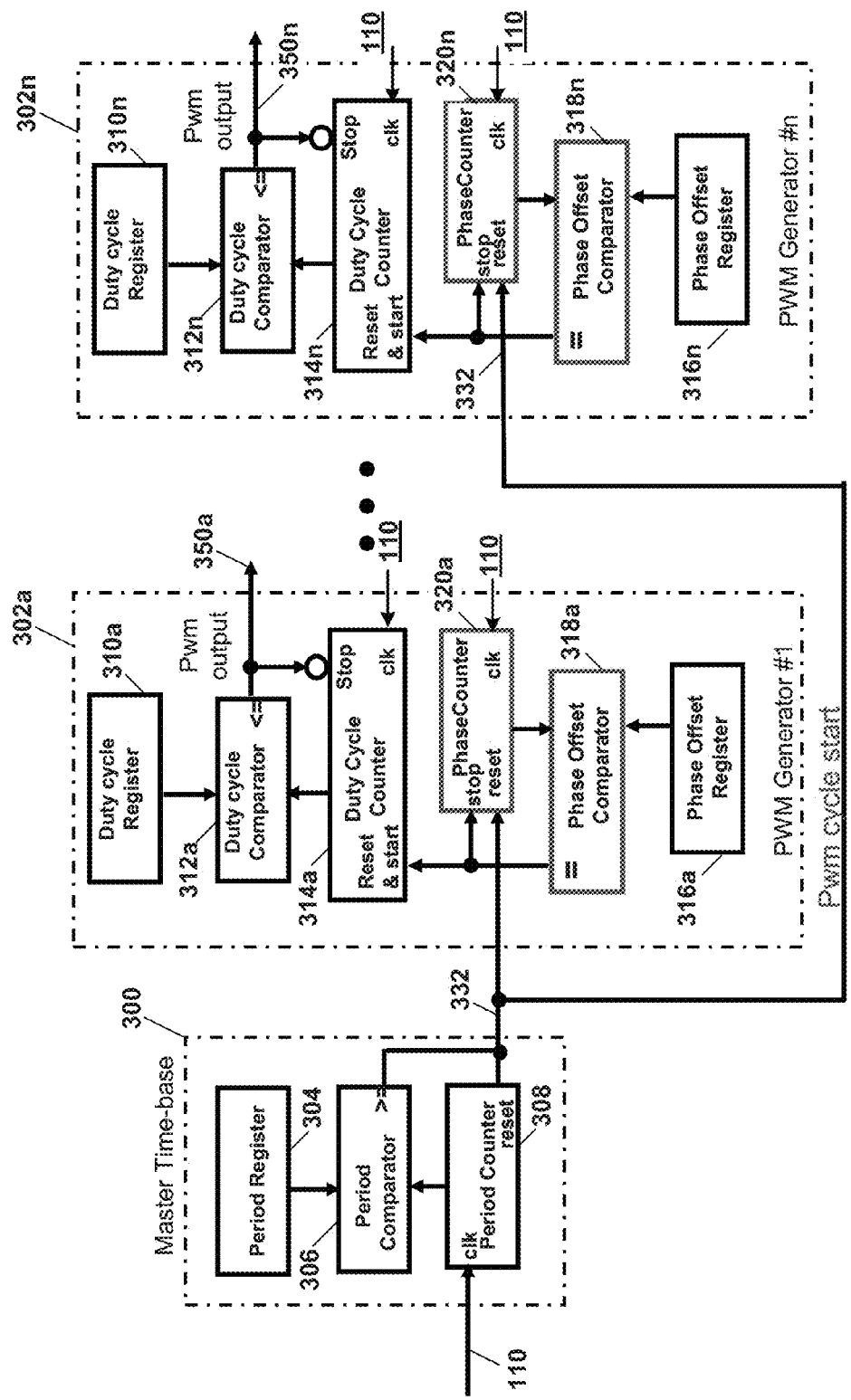
FIG. 3 illustrates a schematic block diagram of a multiphase PWM signal generation circuit capable of generating repetitive single cycle PWM signals, according to a specific example embodiment of this disclosure.

Referring to FIG. 3, depicted is a schematic block diagram of a multiphase PWM signal generation circuit capable of generating repetitive single cycle PWM signals, according to a specific example embodiment of this disclosure. A master time-base 300 comprises a period register 304, period comparator 306 and a period counter 308 that control the period of each of the PWM signals from the PWM generators 302a-302n. The period counter 308 counts up from zero until it reaches a value specified by the period register 304 as determined by the period comparator 306. The period register 304 contains a user specified value which represents the maximum period count value that determines the PWM period.

Each of the PWM generator circuits 302 comprises a duty cycle register 310, a duty cycle comparator 312, a duty cycle counter 314, a phase counter 320, a phase offset comparator 318 and a phase offset register 316. A phase offset value in the phase offset register 316 is used to determine the phase offset of a respective PWM output 350 from each of the PWM generators 302. A duty cycle value in the duty cycle register 310 determines a duty cycle (percent of time on) within a period of the PWM signal 350. The duty cycle and phase offset registers 310 and 316, respectively, are programmed to values required to obtain the desired PWM duty cycle and phase offset for each of the PWM outputs 350. The output of the duty cycle comparators 312 provide the PWM signals 350 as a repetitive series of single cycle PWM signals.

The PWM cycle start signal 332 resets the phase counters 320 in each of the PWM generators 302. Once reset, each of the phase counters 320 begin counting again. A phase counter 320 continues counting until the phase offset comparator 318 determines that the count in the phase counter 320 matches the phase offset value stored in the phase offset register 316. Then the phase offset comparator 318 stops the phase counter 320 until it is reset again by the PWM cycle start signal 332. The phase offset comparator 318 also resets the duty cycle counter 314 when the phase count value is equal to the phase offset value. The outputs of the duty cycle comparators 312 provide the PWM signals 350 as a repetitive series of single cycle PWM signals.

When the phase counters 320 receive the PWM cycle start signal 332, each of the phase counters 320 are reset and begin counting again until the phase count value matches the phase offset value stored in the phase offset register 316. Then the phase offset comparator 318 stops the phase counter 320 until it is reset again by the PWM cycle start signal 332. The phase offset comparator 318 also resets the duty cycle counter 314 when the phase count value is equal to the phase offset value.

Once the duty cycle counter 314 is reset it starts counter again and continues counting until its count value matches the duty cycle value stored in the duty cycle register 310, at which time the duty cycle comparator 312 stops the duty cycle counter 314 from counting until the duty cycle counter 314 is reset by the reset signal from the phase offset comparator 318. The output of the duty cycle comparator 312 also provides the PWM signal 350 which is a repetitive series of single cycle PWM signal generation processes initiated each time there is assertion of a PWM cycle start signal 332.

The phase counters 320 are synchronized to the master time-base 300 by the PWM cycle start signal 332. The individual PWM signal outputs 350 may differ in phase (determined by the respective phase offset registers 316) but not in period (frequency) as determined by the contents of the period register 304. Separate phase counters 320 are used to create the phase shifts of the PWM signals 350 instead of the traditional way of using either a time base counter preload value or an adder to create the phase shift offset relative to the PWM time base 300 and the duty cycle for each of the PWM generators 302. According to the teachings of this disclosure, separating the phase shifting process from the duty cycle generation process eases the task of preserving the duty cycle and phase relationships among the various PWM channels following an asynchronous external synchronization event, e.g., the PWM cycle start signal 332.

Figure 4:
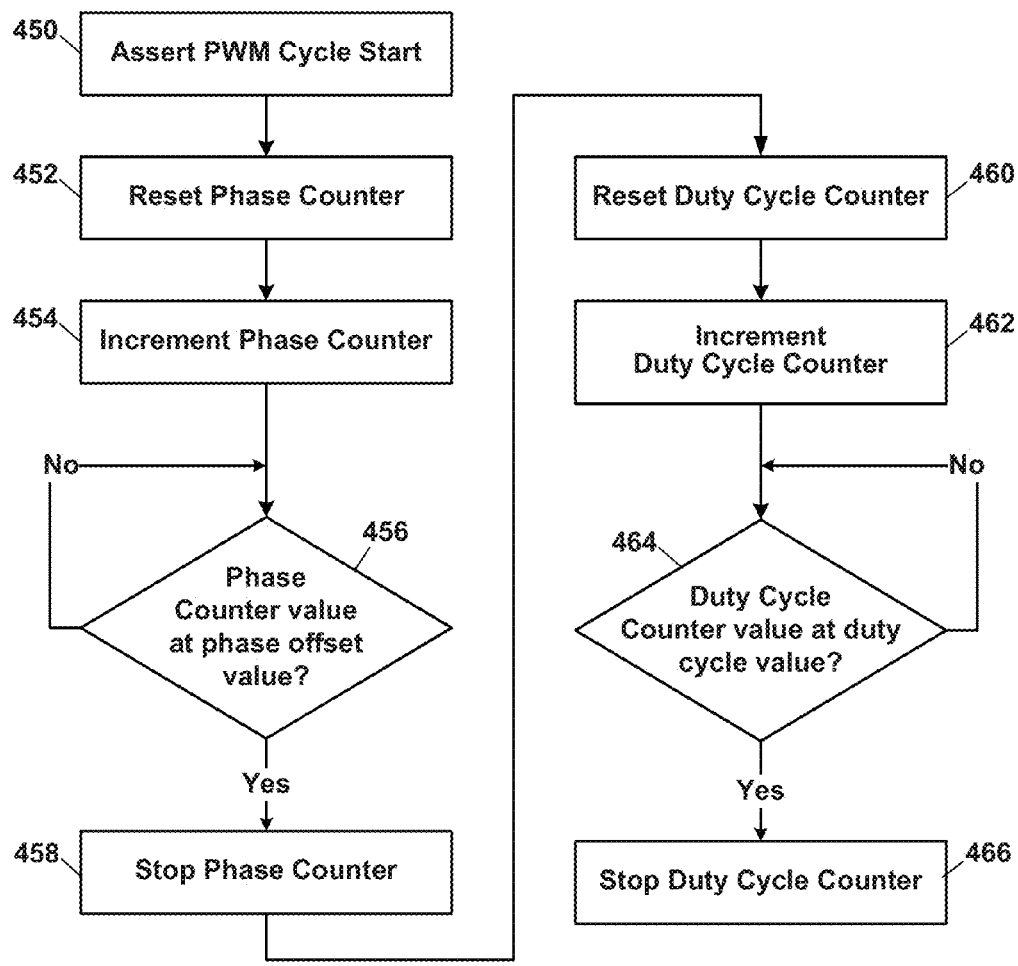
FIG. 4 illustrates a schematic process flow diagram of the operation of the multiphase PWM signal generation circuit shown in FIG. 3.

Referring to FIG. 4, depicted is a schematic process flow diagram of the operation of the multiphase PWM signal generation circuit shown in FIG. 3. In step 450 the PWM cycle start signal 332 is asserted which, in step 452, resets the stopped phase counter 320 to a zero count. In step 454 the phase counter 320 starts counting (incrementing the phase count value). Step 456 determines when the phase count value is equal to the phase offset value in the phase offset register 316. In step 458, the phase counter 320 stops counting when the phase count value is equal to the phase offset value. In step 460 the duty cycle count value in the duty cycle counter 314 is reset to a zero count, and in step 462 the duty cycle count value begins incrementing. Step 464 determines when the duty cycle count value is equal to the duty cycle value in the duty cycle register 310. In step 466, the duty cycle counter 314 stops counting when the duty cycle count value is equal to the duty cycle value in the duty cycle register 310. This entire cycle repeats itself each time a PWM cycle start signal 332 is asserted.

Figure 5:
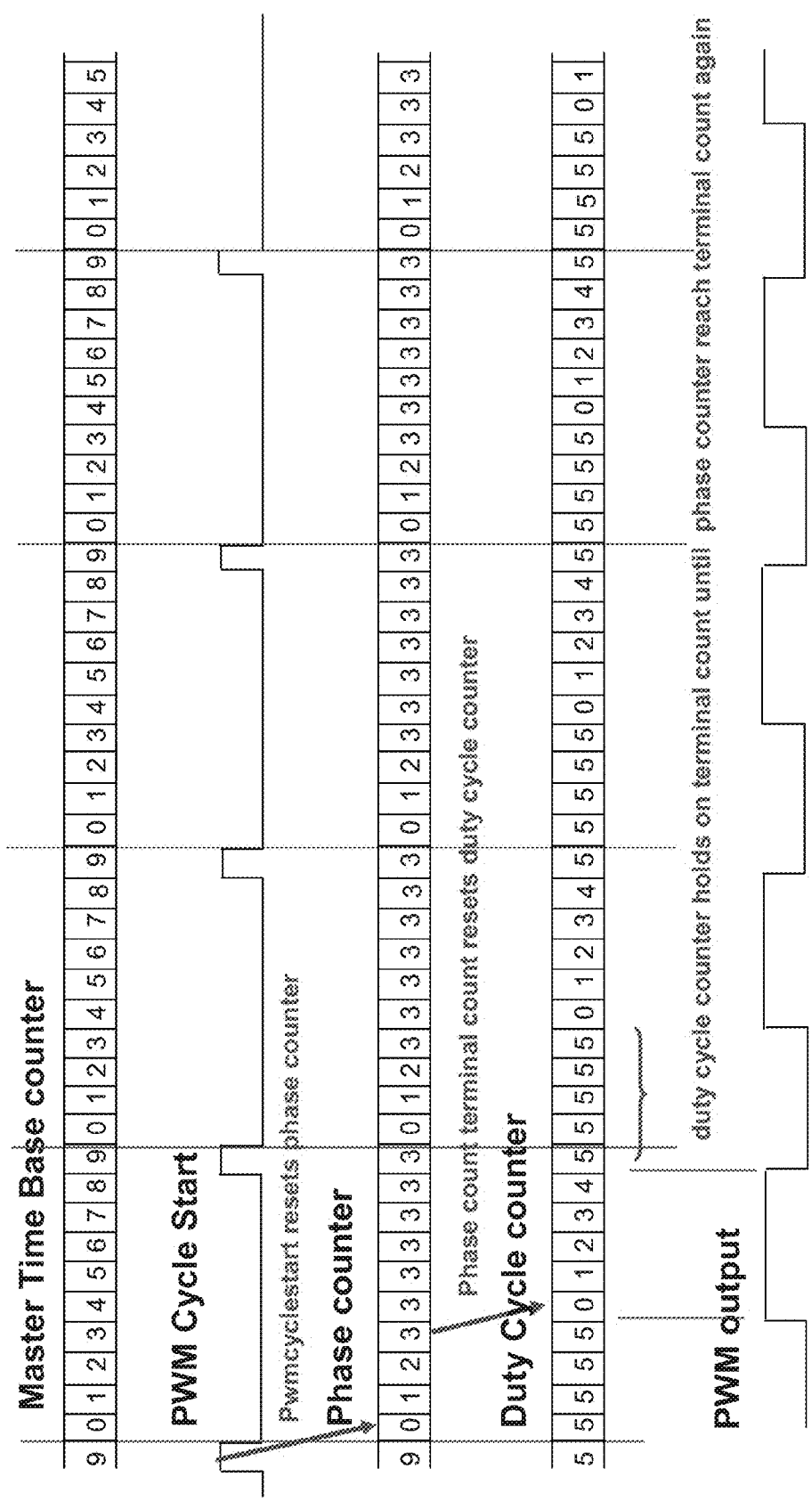
FIG. 5 illustrates a schematic timing diagram of the multiphase PWM signal generation circuit shown in FIG. 3.

Referring to FIG. 5, depicted is a schematic timing diagram of the multiphase PWM signal generation circuit shown in FIG. 3. A illustrated, the PWM cycle start signal 332 resets the phase counter 320, allowing it to begin counting until the phase count thereof is equal to the phase offset value stored in the phase offset register 316. Then counting in the phase counter 320 remains stopped until another PWM cycle start signal 332 resets the phase counter 320 again. When the phase counter 320 stops counting (count value=phase offset value) the duty cycle counter 314 is reset to zero and starts counting until it reaches its terminal count (duty cycle count=duty cycle value), and it stops counting and will remain at its terminal count until reset again by the phase counter 320 reaching its terminal count (i.e., phase counter 320 stops).

Figure 6:
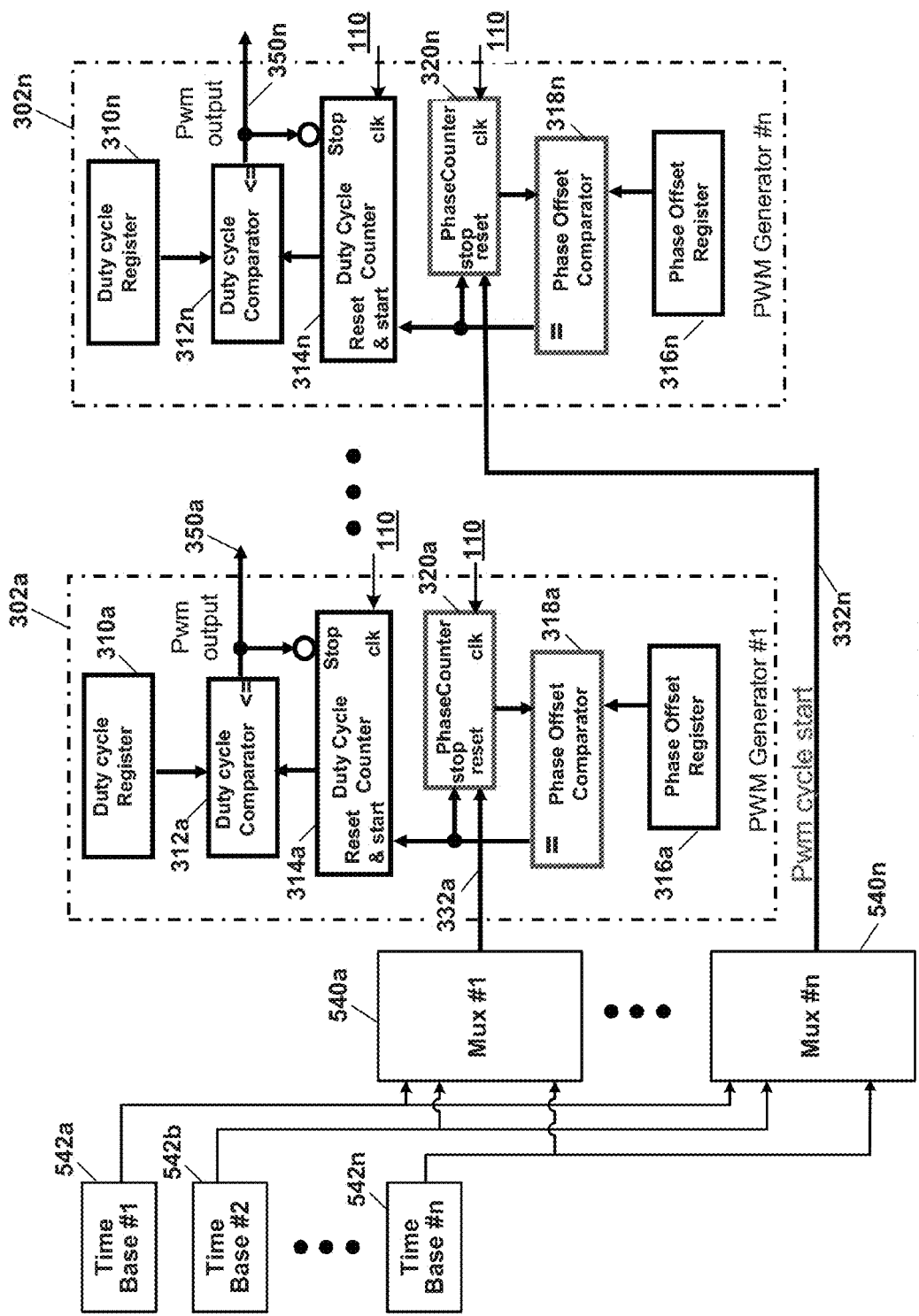
FIG. 6 illustrates a schematic block diagram of a multiphase and multi-frequency PWM signal generation circuit capable of generating repetitive single cycle PWM signals at different frequencies and phases offsets, according to another specific example embodiment of this disclosure.

Referring to FIG. 6, depicted is a schematic block diagram of a multiphase and multi-frequency PWM signal generation circuit capable of generating repetitive single cycle PWM signals at different frequencies and phases offsets, according to another specific example embodiment of this disclosure. Functionally each one of the PWM generators 302 functions as described hereinabove. However, the operating period (frequency) of the each of the PWM generators 302 may be different and independent as determined by which time base 542 is coupled to a respective PWM generator 302 through an associated multiplexer 540. A plurality of time bases 542 may be coupled to multiplexers 540, one multiplexer 540 being associated with each one of the PWM generators 302.

Figure 7:
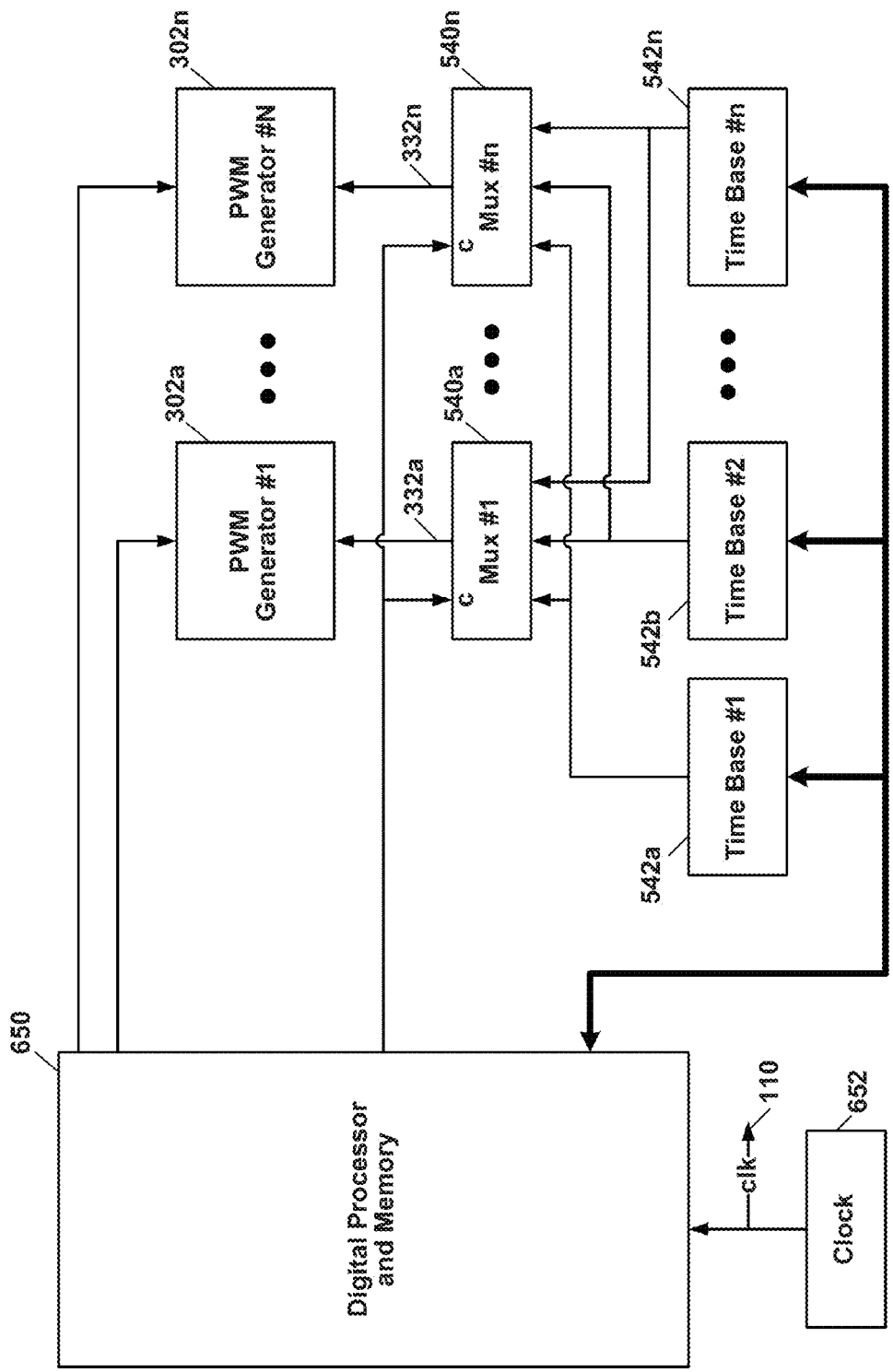
FIG. 7 illustrates a schematic block diagram of the multiphase and multi-frequency PWM signal generation circuit of FIG. 5 coupled to a digital processor, according to the teachings of this disclosure.

Referring to FIG. 7, depicted is a schematic block diagram of the multiphase and multi-frequency PWM signal generation circuit of FIG. 6 coupled to a digital processor, according to the teachings of this disclosure. A digital processor and memory 650 may send new PWM operating data to the PWM generators 302 and the time bases 542, e.g., period(s), duty cycles and phase offsets and may be initiated by application software running in the digital processor 650. A clock 652 may have at least one clock output for driving the clock inputs of the master-time bases 542, digital processor and memory 650, and the PWM generators 302. The digital processor and memory 650 may. The digital processor may be, for example but is not limited to, a microcontroller, a microprocessor, a digital signal processor (DSP), etc., and may be a separate integrated circuit or be part of the same integrated circuit comprising the PWM generation circuits described hereinabove.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for generating a repetitive single cycle PWM signal, comprising:
a duty cycle register storing a duty cycle value;
a duty cycle counter having a clock input coupled to a clock generating a plurality of clock pulses and incrementing a duty cycle count value for each of the plurality of clock pulses received;
a duty cycle comparator coupled to the duty cycle register and the duty cycle counter, wherein the duty cycle comparator compares the duty cycle count value to the duty cycle value and generates a PWM signal when the duty cycle count value is less than or equal to the duty cycle value and stops the duty cycle counter when the duty cycle count value is greater than the duty cycle value;
a phase counter having a clock input coupled to the clock generating the plurality of clock pulses and incrementing a phase count value for each of the plurality of clock pulses received, and a reset input adapted for coupling to a PWM cycle start signal from a time base, wherein when the PWM cycle start signal is asserted the phase count value is reset to zero, thereby restarting the phase counter;
a phase offset register storing a phase offset value; and
a phase offset comparator coupled to the phase offset register, the phase counter and a stop input thereof, wherein the phase offset comparator compares the phase count value to the phase offset value and stops the phase counter when the phase count value is equal to the phase offset value and resets the duty cycle value to zero, thereby restarting the duty cycle counter.

2. The apparatus according to claim 1, further comprising a digital processor and memory coupled to the duty cycle register and the phase offset register, wherein the digital processor and memory load the duty cycle and phase offset values, respectively, therein.

3. The apparatus according to claim 2, wherein the digital processor is a microcontroller.

4. The apparatus according to claim 2, wherein the digital processor is a microprocessor.

5. The apparatus according to claim 2, wherein the digital processor is a digital signal processor (DSP).

6. A system for generating a plurality of repetitive single cycle pulse width modulation (PWM) signals, said system comprising:
a master time base generator, wherein the master time base generator comprises:
a master period register storing a master period value;
a master period counter having a clock input coupled to a clock generating a plurality of clock pulses, and incrementing a master count value for each of the plurality of clock pulses received;
a master period comparator coupled to the master period register and the master period counter, wherein the master period comparator compares the master count value to the master period value, generates a PWM cycle start signal when the master count value is equal to or greater than the master period value, and then resets the master count value in the master period counter to zero; and
a plurality of PWM generators for generating a plurality of repetitive single cycle PWM signals, each of the plurality of PWM generators comprises:
a duty cycle register storing a duty cycle value;
a duty cycle counter having a clock input coupled to the clock and incrementing a duty cycle count value for each of the plurality of clock pulses received;
a duty cycle comparator coupled to the duty cycle register and the duty cycle counter, wherein the duty cycle comparator compares the duty cycle count value to the duty cycle value and generates a PWM signal when the duty cycle count value is less than or equal to the duty cycle value and stops the duty cycle counter when the duty cycle count value is greater than the duty cycle value;
a phase counter having a clock input coupled to the clock generating the plurality of clock pulses and incrementing a phase count value for each of the plurality of clock pulses received and a reset input coupled to the master time base, wherein when the PWM cycle start signal from the master time base is asserted the phase count value is reset to zero, thereby restarting the phase counter;
a phase offset register storing a phase offset value; and
a phase offset comparator coupled to the phase offset register, the phase counter and a stop input thereof, wherein the phase offset comparator compares the phase count value to the phase offset value and stops the phase counter when the phase count value is equal to the phase offset value and resets the duty cycle value to zero, thereby restarting the duty cycle counter.

7. The system according to claim 6, further comprising a digital processor and memory coupled to the master period register, the duty cycle register and the phase offset register, wherein the digital processor and memory load the master period, duty cycle and phase offset values, respectively, therein.

8. The system according to claim 7, wherein the digital processor is a microcontroller.

9. The system according to claim 7, wherein the digital processor is a microprocessor.

10. The system according to claim 7, wherein the digital processor is a digital signal processor (DSP).

11. The system according to claim 6, further comprising a plurality of multiplexers and a plurality of time bases coupled to respective inputs of the plurality of multiplexers, wherein each of the plurality of PWM generators can be coupled to a respective one of the plurality of time bases.

12. The system according to claim 11, further comprising a digital processor and memory coupled to and controlling the plurality of multiplexers during selection of the respective ones of the plurality of time bases.

13. A system for generating a plurality of repetitive single cycle pulse width modulation (PWM) signals, said system comprising:
a plurality of time base generators, wherein each of the plurality of time base generators comprises:
a period register storing a period value;
a period counter having a clock input coupled to a clock generating a plurality of clock pulses, and incrementing a period count value for each of the plurality of clock pulses received;
a period comparator coupled to the period register and the period counter, wherein the period comparator compares the period count value to the period value, generates a PWM cycle start signal when the count value is equal to or greater than the period value, and then resets the count value in the period counter to zero;
a plurality of multiplexers having inputs coupled to the PWM cycle start signals from the plurality of time base generators; and
a plurality of PWM generators for generating a plurality of repetitive single cycle PWM signals, each of the plurality of PWM generators comprises:
a duty cycle register storing a duty cycle value;
a duty cycle counter having a clock input coupled to the clock and incrementing a duty cycle count value for each of the plurality of clock pulses received;
a duty cycle comparator coupled to the duty cycle register and the duty cycle counter, wherein the duty cycle comparator compares the duty cycle count value to the duty cycle value and generates a PWM signal when the duty cycle count value is less than or equal to the duty cycle value and stops the duty cycle counter when the duty cycle count value is greater than the duty cycle value;
a phase counter having a clock input coupled to the clock generating the plurality of clock pulses and incrementing a phase count value for each of the plurality of clock pulses received and a reset input coupled to an output of a respective one of the plurality of multiplexers, wherein a respective PWM cycle start signal is selected through the plurality of multiplexers and when asserted the phase count value is reset to zero, thereby restarting the phase counter;
a phase offset register storing a phase offset value; and
a phase offset comparator coupled to the phase offset register, the phase counter and a stop input thereof, wherein the phase offset comparator compares the phase count value to the phase offset value and stops the phase counter when the phase count value is equal to the phase offset value and resets the duty cycle value to zero, thereby restarting the duty cycle counter.

14. A method for generating a plurality of repetitive single cycle pulse width modulation (PWM) signals, said method comprising the steps of:
storing a master period value in a master period register;
incrementing a master count value in a master period counter for each clock pulse received by the master period counter;
comparing the master count value to the master period value with a master period comparator;
generating a PWM cycle start signal when the master count value is equal to or greater than the master period value and then resetting the master count value to zero;
restarting a plurality of PWM generators with the PWM cycle start signal, wherein each of the plurality of PWM generators generates a PWM signal that is synchronized with the PWM cycle start signal, operation of each of the plurality of PWM generators comprises the steps of:
storing a duty cycle value in a duty cycle register;
incrementing a duty cycle count value in the duty cycle counter for each clock pulse received by the duty cycle counter;
comparing the duty cycle count value to the duty cycle value with a duty cycle comparator;
generating a PWM signal when the duty cycle count value is less than or equal to the duty cycle value;
stopping the duty cycle counter when the duty cycle count value is greater than the duty cycle value;
storing a phase offset value in a phase offset register;
incrementing a phase count value in the phase counter for each clock pulse received by the phase counter;
comparing the phase count value to the phase offset value with a phase offset comparator;
stopping the phase counter and resetting the duty cycle count value to zero when the phase count value is equal to the phase offset value; and
resetting the phase count value to zero when the PWM cycle start signal is received by the phase counter.

15. The method according to claim 14, further comprising a digital processor and memory performing the steps of:
storing the master period value in the master period register;
storing the duty cycle value in the duty cycle register; and
storing the phase offset value in the phase offset register.

16. The method according to claim 15, wherein the digital processor is a microcontroller.

17. The method according to claim 15, wherein the digital processor is a microprocessor.

18. The method according to claim 15, wherein the digital processor is a digital signal processor (DSP).

* * * * *